United States Patent [19]

Sloane

[11] Patent Number: 5,047,969
[45] Date of Patent: Sep. 10, 1991

[54] GENERAL NETWORK MODELING AND SYNTHESIS

[75] Inventor: Edwin A. Sloane, Los Altos, Calif.

[73] Assignee: Schlumberger Technologies, Limited, Farnborough, England

[21] Appl. No.: 283,447

[22] Filed: Dec. 15, 1988

[51] Int. Cl.$^5$ .............................................. G06G 7/14
[52] U.S. Cl. ..................................... 364/578; 364/581
[58] Field of Search ............... 364/727, 578, 725, 581, 364/572, 488; 371/23; 307/204; 324/73 AT

[56] References Cited

U.S. PATENT DOCUMENTS

| | | | |
|---|---|---|---|
| 4,809,194 | 2/1989 | Crookshanks | 364/581 |
| 4,811,259 | 3/1989 | Costas | 364/581 |

OTHER PUBLICATIONS

Colin R. Edwards, IEEE, Jan. 1975, pp. 48–62, The Application of the Rademacher–Walsh Transform . . .

B. D. Chen and Y. Y. Sun, Int. J. Electronics, 1980, vol. 48, No. 3, 243–256, Waveform Synthesis via Inverse Walsh Transform.

G. Frangakis and S. Tzafestas, Electronic Engineering, Jul. 1979, 89–91, vol. 51, No. 625, A Digital Walsh Function Analyser.

"A theory for the Experimental Determination of Optimum Nonlinear Systems," Amar G. Bose, MIT, Cambridge, Mass.

"A Full Range of Solutions Emerge to Handle Mixed–Mode Simulation," Richard Goering, *Computer Design*, 2/1/88.

Primary Examiner—Parshotam S. Lall
Assistant Examiner—Michael Zanelli
Attorney, Agent, or Firm—Townsend and Townsend

[57] ABSTRACT

A method and apparatus for modeling and synthesizing the response of a network to selected input signals where the input signals may be multi-channel in analog or digital form, and where the network's response may be linear or non-linear and depend on the present input signals as well as its past responses. A relationship is established between the input signals and the network's response to the input signals. Basis vectors are selected capable of representing the relationship. Weighting values for each basis vector are calculated. The calculated weighting values are applied to the corresponding basis vectors to form weighted basis vectors. The synthesis and modeling are then performed by forming a linear combination of the weighted basis vectors. Provision is made for feeding back the linear combination to account for memory and other history-dependent responses of the network.

2 Claims, 11 Drawing Sheets

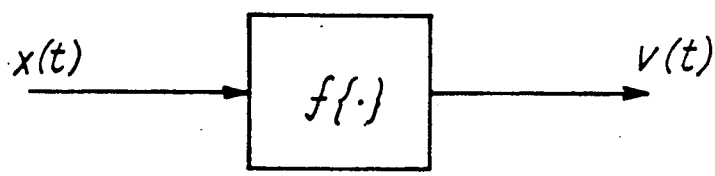
FIG.1
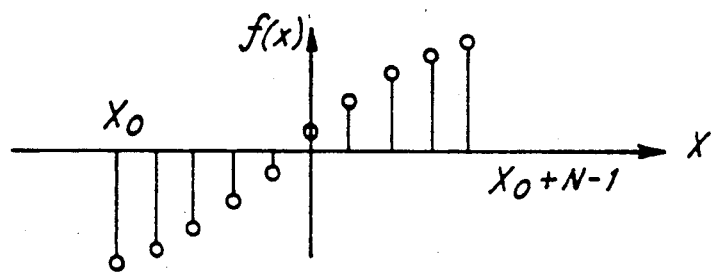
FIG.2
FIG.3a
FIG.3b
FIG.3c

GENERAL NETWORK MODELING AND SYNTHESIS

BACKGROUND OF THE INVENTION

1. Field of the Invention

The present invention relates generally to the field of signal processing networks, and more particularly to a method and apparatus for modeling a network capable of processing analog and/or digital signals, with linear or non-linear response characteristics, capable of receiving multichannel inputs and outputs that may o may not be history dependent.

2. Description of the Relevant Art

Modeling and synthesis techniques involve determination of the relationship or relationships between selected inputs to a network and the desired or actual output of the network in response to those inputs. The techniques are fundamental to the arts of Computer Aided Design (CAD), Computer Aided Engineering (CAE), Test System Design, Simulation, Etc.

As used herein, synthesis of a network involves deriving a mechanism (e.g., one or more functions, values stored in a look-up table, etc.) which represents the network's response to certain inputs or ranges of inputs. Similarly, modeling a network involves utilizing the synthesized mechanism in a system in place of the actual network.

Problems of modeling and synthesis of networks fall into several categories of complexity which limit the applicability of particular existing modeling and synthesis techniques. A network may operate on analog or digital signals, or both. The response of the network may be linear or non-linear. The present response may depend on one or more of the past inputs or responses of the network. The network may operate on one or more channels of input. Any and all of these network characteristics increase the complexity of the modeling and synthesis of the network and, consequently, reduce the number of available techniques for modeling and synthesis.

There exist many methods of modeling and synthesizing linear networks, from linear regression to complex numerical modeling. The number of methods available is significantly reduced when the network's response is non-linear. There are three major methods traditionally used to model the input/output relationships of the non-linear network. The first is the quasi-linear methods of the Taylor Series Perturbation and Describing functions. The second is the differential equation method. The third is the integral equation or functional (or Wiener) method. Each of these methods is briefly described below.

The Taylor Series Perturbation method involves establishing a dynamic operating point about which a Taylor Series is used to represent small signal deviations as perturbations, i.e., network response to an input. The disadvantages of the Taylor Series method involve the fact that the method depends upon the existence of derivatives of the response function (or "gain") to determine the functional response of the network. If such derivatives do not exist, the algorithm used fails to converge. This implies that only "smooth" non-linearities can be tolerated. An example of an application of this method is the SPICE computer program for use in circuit analysis.

The describing function method involves producing a linearized model for each contribution to the output of the network. Sinusoidal describing functions, for example, form a linear network that represent an output as an undistorted sinusoid of the same frequency as the input signal and with a "gain" corresponding to the gain of the actual network at the excitation frequency. The method requires a new and possibly different model for each sinusoidal amplitude and frequency.

A more general describing function can be constructed by using broadband excitation representative of the actual input signal and estimating the gain and phase shift for all pertinent frequencies by means of the input/output cross-spectral density, $S_{vx}(\omega)$, and the input auto-spectral density, $S_{xx}(\omega)$. This results in a linear transfer function estimate, $H(\omega)$, where $$H(\omega) = \frac{S_{vx}(\omega)}{S_{xx}(\omega)}$$

and $$S_{vx}(\omega) = \lim_{T \to \infty} E\left(\frac{1}{T} V_T(\omega) \cdot X_T^*(\omega)\right)$$

$$V_T(\omega) \cdot X_T^*(\omega) = \int_T v(t)e^{-j\omega t}dt \int_T x(t)e^{+j\omega t}dt$$

where $E\{\cdot\}$ is the expected value.

This yields a transfer function (gain and phase shift) at a given frequency based solely on the response, $v(t)$, that is phase coherent with the excitation, $x(t)$. The total output energy consists of the phase coherent signal and a residual output signal, $n(t)$, that is uncorrelated with the excitation $x(t)$. $H(\omega)$ represents the best (mean square error) linear estimate of a transfer function.

The differential equation method involves the direct solution of non-linear differential equations. Because this method is very computation intensive, its implementation is mainly restricted to high-speed computer applications. Further, its results provide a response solution, $v(t)$, only for a specific excitation signal, $x(t)$. Finally, this method may also suffer from convergence problems similar to those mentioned above, depending on the program used for differential equation evaluation.

The integral equation or functional method (developed by Norbert Wiener) involves consideration of not only the instantaneous non-linear distortions of present input values, but also non-linear interactions, over time, of past and present data. This is a characteristic of the general network problem involving memory (or history dependence).

The functional method represents memory with an infinite set of orthogonal filters such as a bank of filters having the different order Laguerre functions as their impulse responses. The complete set of filter outputs, $\{u_i(t)\}$, at a given point in time constitute, in some sense, a complete history of the excitation signal, $x(t)$. Specifically, $$u_i(t) = \int_0^\infty h_i(\tau)x(t - \tau)d\tau.$$

From which a general non-linear function may be constructed using the following multinomial power series $$v(t) = a_o + \sum_{i=0}^{\infty} a_{1i}u_i(t) + \sum_{i,j} a_{2ij}u_i(t)u_j(t) + \ldots$$
$$+ \sum_{i,j,\ldots} a_{nij}u_i(t)u_j(t)\ldots + \ldots$$

Substituting the expression for $u_i(t)$ yields $v(t)$ in the form of a Volterra equation of the first kind $$v(t) = k_o + \int_0^{\infty} k_1(T_1)x(t - T_1)dT_1 +$$

$$\int_0^{\infty}\int_0^{\infty} k_2(T_1, T_2)x(t - T_1)x(t - T_2)dT_1dT_2 + \ldots +$$

$$\int_n \ldots \int_0^{\infty} k_n(T_1, T_2, \ldots T_n)x(t - T_1)x(t - T_2)\ldots x(t - T_n)dT_1dT_2\ldots dT_n + \ldots.$$

where $$k_n(T_1, T_2, \ldots T_n) = \sum_{i,j,\ldots} a_{nij}\ldots h_i(T_1)h_j(T_2)\ldots$$

$K_n(.)$ is the nth order impulse response of the network, an n-dimensional impulse response function that has a corresponding n-dimensional Fourier transform $$k_n(T_1,T_2,\ldots T_n) \longleftrightarrow K_n(\omega_1,\omega_2,\ldots\omega_n)$$

which represents the broadband or multifrequency response of the network to all combinations of frequencies taken n at a time. The resulting transfer function $K_n(.)$ gives the gain and the phases at each of the interacting frequencies.

Although the functional method is comprehensive, its applications have been limited to modeling mildly non-linear networks requiring the determination of a small set of low order terms, for example as operational amplifier networks with small third order distortion. In the case of severe or non-integer-power non-linearities, the power series expansion is grossly inefficient because of the large number of terms required.

To compound the complexities and inadequacies of the above-mentioned methods, the general network solution must not be limited by any distinctions between analog and digital signals, especially when the inputs may be in mixed analog and digital form. These networks, representing the interface between the digital computer domain and the "natural" analog world, are characterized by "hard" non-linearities such as thresholding elements in analog to digital converters. Also, the logic networks are grossly non-linear, so that the combination of both types in a single network present formidable modeling problems. None of the above-mentioned methods have been able to adequately deal with the mixed analog and digital signal cases.

Finally, a realistic model of a network must be able to represent the case of multichannel inputs. For example, when modeling the response of a semiconductor element, time-varying values such as current density, temperature, electric field, etc., all contribute to the response characteristics of the device. Proper consideration of multichannel inputs increases the number of possible bit interactions exponentially, and correspondingly increases the complexity of the synthesis and resulting model.

There is a present need in the art for a method and system for modeling and synthesis of networks of mixed analog and/or digital signals having linear or non-linear responses which may receive a plurality of input channels and whose inputs may be memory dependent, which overcome the limitations and disadvantages of the prior art. The present invention provides such a method and system, as further described in detail below.

SUMMARY OF THE INVENTION

The present invention is directed to a method and system for modeling and synthesizing a logic network or a network of analog, digital or mixed analog and digital signals having a linear or non-linear response to past and present values of a plurality of input channels. Such a network is generically referred to as a "General Network." Hence, the present invention provides a method and system for modeling and synthesizing a General Network.

Modeling and synthesizing of the General Network in the present invention is based on digital or quantized analog multichannel inputs, and either analog or digital outputs. Such quantized analog input signals may be acquired from analog inputs via a continuous analog-to-digital converter (quantizer), sampling analog-to-digital converter, or other quantizing means.

The model itself is based on a specified relationship between the inputs and outputs of the network. This input/output relationship may be defined by a reference model whose behavior the network emulates. Since the precise nature of the functional relationship between inputs and outputs may not be known for the network, the reference model may be used as a means for synthesizing the General Network's behavior.

The present invention proposes a modeling system including means for generating a plurality of vector elements each representative of a unique combination of said inputs;

means for applying to each element a predetermined weighting coefficient, and;

means for combining said weighted elements in a linear manner;

said weighting coefficients being selected such that said combination yields the expected or desired output of said reference network in response to said inputs.

A network to be synthesized is modelled either as a feedforward or feedback network. An appropriate basis set of functions is selected, which set consists of basis vectors capable of representing the corresponding specified input/output relationship. There are many groups of functions which, when properly combined, are capable of synthesizing virtually any function. As a general rule, these groups form complete orthogonal sets, such as the Legendre polynomials, the Walsh functions, etc. Since the present invention operates on binary signals, the binary Walsh functions are quite well suited to the method of the present invention, and are utilized in the preferred embodiment described below.

Associated with each vector of the basis set of functions are real-valued weighting coefficients. The values of the weighting coefficients are determined from the relationship between the inputs and the outputs of the network. In the preferred embodiment, a Walsh Exclusive-Or decoder generates all possible unique combinations of the input bits, so as to represent both linear and non-linear elements of the network's response. The Walsh Exclusive-Or decoder is a preprogrammed series of Exclusive-Or gates which are capable of producing all possible interactions of the input bits. The interactions formed at the output of the Walsh Exclusive-Or decoder are Walsh functions, each unique input bit pattern producing a Walsh function of corresponding order. The appropriate weighting value for each combination of bits is determined by a Fast Walsh Transform.

A linear combination of the weighting coefficients is formed for each basis (Walsh) vector, and the set of resulting weighted basis vectors forms the General Network model. The array of weighting values determined for each of the basis vectors may be stored in a look-up table, or other memory device, for recall in response to appropriate inputs in order to avoid repetitious calculations.

The present invention will be more readily understood from the following detailed description of the preferred embodiment. The detailed description is to be taken in conjunction with the accompanying drawings described briefly below.

It will be appreciated that where the reference network is an abstract target network which is functionally specified, the modeling cell represents a network synthesized to achieve the target specification. Thus, networks may be synthesized on the basis of design functional specifications, for example in a computer aided engineering system.

BRIEF DESCRIPTION OF THE DRAWINGS

FIG. 1 shows the input-output relationship of an arbitrary network;

FIG. 2 shows a example of the domain of a network's response to a quantized analog input signal;

FIGS. 3a, b and c show examples of Walsh matrices, $W_N$, whose rows and columns are Walsh functions of rank N=2, 4 and 8, respectively;

DETAILED DESCRIPTION OF THE PREFERRED EMBODIMENT

Figure 4:
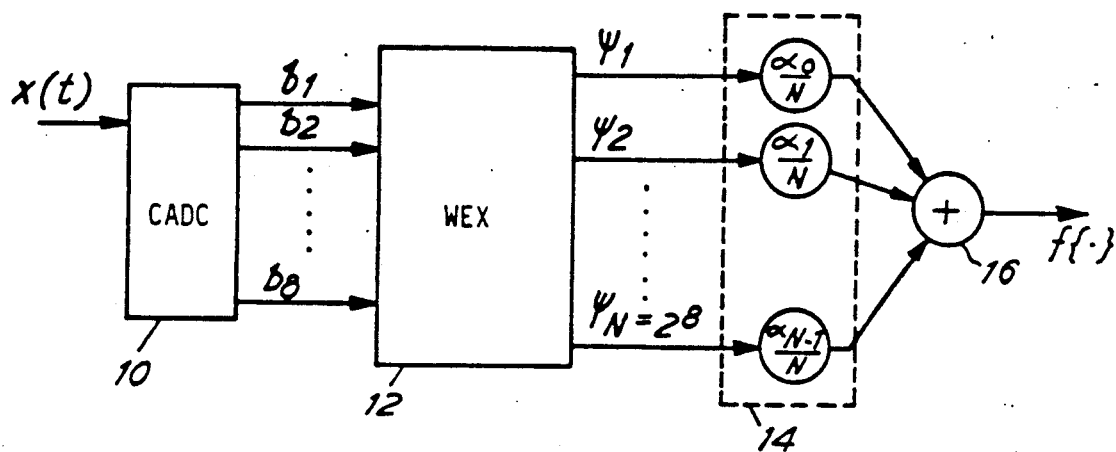
FIG. 4 shows the basic structure for the General Network modeling of the network shown in FIG. 1.

FIG. 1 shows a model of a system with a functional relationship between input and output signals defined as $v(t)=f\{x(t)\}$. The input signals, x(t), may be in digital form, analog form or a combination of the two. Further, the input signals may be a field or fields of time varying bits. The nature of the input signals will be determined by the specific application of the present invention. Likewise, the output signals, v(t), may be digital or analog, depending on the specific application of the present invention. Since it is clear from the above that both the input signals, x(t), and the output signals, v(t), are functions of the variable t, for clarity the notation x as input signals and v as output signals will be used herein.

The functional relationship, $f\{x\}$ may be linear or non-linear. It will be assumed throughout this description that $f\{x\}$ is non-linear, since modeling and synthesis solutions for $f\{x\}$ as a linear function are well developed in the art and are a degenerate case of the general non-linear response. Although it is likely that the precise functional relationship, $f\{x\}$, is not or cannot be known, it will also be assumed throughout this description that the set of ordered pairs $[x_i, v_i]$, where $x_i$ is a particular input signal, and $v_i$ is the corresponding network response, is given for a sufficient range or variety, i.e., the actual or desired output signals for given input signals are known. The criteria for determining the sufficient range is that the number of ordered pairs must be at least equal to the degrees of freedom of the network (the latter point is discussed in greater detail below).

It is known that weighted sums of Walsh functions are well suited to the representation of arbitrary functions (see Corrington, *ADVANCED ANALYTICAL AND SIGNAL PROCESSING TECHNIQUES, ASTIA* doc. no. AD277942, 1962, which document is incorporated by reference herein). Consider the expansion of $f\{x\}$ on the domain X, x e X (that is, x being an element of X), in terms of the Walsh functions. For any domain X consisting of a binary number of states, $N=2^q$, there exists a complete set of N orthogonal Walsh functions $\{\Psi_k(x)\}$ of corresponding binary rank, N, so that $$f\{x\} = \frac{1}{N} \sum_{k=0}^{N-1} a_k \Psi_k(x), \quad x \epsilon X, \psi \epsilon \Psi$$

k being the order of the Walsh function $\Psi_k(x)$.

To allow an ordered processing of x, and limit the dimensions of the modeling problem, any analog components of x are quantized, i.e., digitized. This quantization may be accomplished, for example, by applying the input signals to a continuous or discrete time sampling analog-to-digital converter. (For a discussion of continuous analog-to-digital conversion, see application for United States Letters Patent, Ser. No. 07/283,446, filed Dec. 15, 1988, which is expressly incorporated by reference herein.) It should be noted that although the analog input signals are quantized (digitized) in the present invention, the analog input signals may be asynchronous and need not be sampled, i.e., the establishing of digital values for the analog input signals may be asynchronous and need not be periodic or tied to a particular clock cycle. The resulting quantized signal would comprise q binary bits, and the domain of the response of the system, f{x}, would lie on the interval of $N=2^q$ segments between $x_o$ and $x_o + N-1$, as illustrated in FIG. 2. The quantized analog components of x, together with any digital components of x, are symbolically represented hereafter as a vector of bits, b (again, it is understood that b may be a time-varying function, i.e., b(t)).

The quantizing (digitizing) of the analog input signals does not affect the relationship between the input and output signals (or affect the ordered pairs $[x_i, v_i]$). This stems from the fact that a quantized signal (which is not limited by a sampling period) does not suffer from aliasing error (it may, however, suffer from quantization error). Thus, the relationship between x and b is an equivalence relationship, i.e., $$x \longleftrightarrow (b_q b_{q-1} ... b_1)^T = b$$

where the superscript T represents the transpose of the associated vector.

In terms of the quantized variable b, this equivalence implies $$f\{b\} = \frac{1}{N} \sum_{k=0}^{N-1} \alpha_k \psi_k(b)$$

where $$\alpha_k = \sum_{b=0}^{N-1} f\{b\} \psi_k(b)$$

and hence relates the non-linear operation f{x}, to the quantized input b-vector.

Of the last two expressions, the later represents the Walsh transform of f{b}, while the former represents the inverse Walsh transform of f{b}. (The Walsh transform and inverse transform are analogous to the Fourier transform and inverse transform.) Thus, the relationship between input and output signals of the network may be functionally represented by a weighted sum of Walsh functions, the weights determined from the ordered pair $[x_i, v_i]$.

Examples of sampled Walsh matrices, $W_N$, of rank N=2, 4 and 8 (q=1, 2 and 3) whose rows and columns are sampled Walsh functions are shown in FIGS 3 a, b and c, respectively. (In FIGS. 3 a, b and c, a "+" indicates a value of +1 and a "−" indicates a value of −1 as between the matries and the corresponding Walsh functions). Each column (and row, due to diagonal symmetry) of the Walsh matrices represents the values of the kth order Walsh function, $\psi_k(x)$, $0 \leq k \leq N-1$, for that rank-N Walsh matrix (i.e., $\psi_k(x)$ takes on values of +1 and −1 only). The diagonal symmetry of the Walsh matrices imply that, in general, $$\psi_i(j) = \psi_j(i)$$

so that $$f\{b\} = \frac{1}{N} \sum_{k=0}^{N-1} \alpha_k \psi_b(k) \text{ and } \alpha_k = \sum_{b=0}^{N-1} f\{b\} \psi_k(b)$$

The domain of k determines the order of Walsh function, N, that enters into the inner product $$f\{b\} = \frac{1}{N} \alpha^T \psi_b(k)$$

where $$\alpha^T = (\alpha_0 \alpha_1 ... \alpha_{N-1})$$

and $\psi_b(k)$ are $N \times 1$ vectors.

Implementation of the method suggested by the above representation of f{x} first involves a determination of the values of the $\alpha_k$ from the ordered pairs $[x_i, v_i]$. The values for $\alpha_k$, $0 \leq k \leq N-1$, may be obtained from the expression $$\alpha_k = \sum_{b=0}^{N-1} f\{b\} \psi_k(b)$$

or in vector notation, $$\alpha = W_N f\{b\}$$

which is the standard form for the Walsh transform of f{b}. It is noted that the values obtained for $\alpha_k$ may be in either digital or analog form depending on the particular application. Furthermore, values of $\alpha_k$ obtained in one form (e.g., digital) may readily be substituted for those in another form (e.g., analog) by means well known in the art.

Figure 5A:
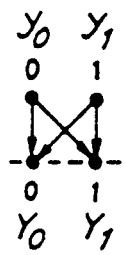
FIGS. 5a, b and c show the signal flow for a Fast Walsh transform for N=2, 4 and 8, respectively.
Figure 5B:
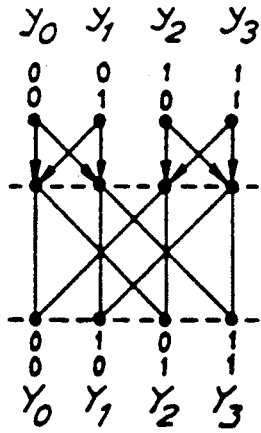
Figure 5C:
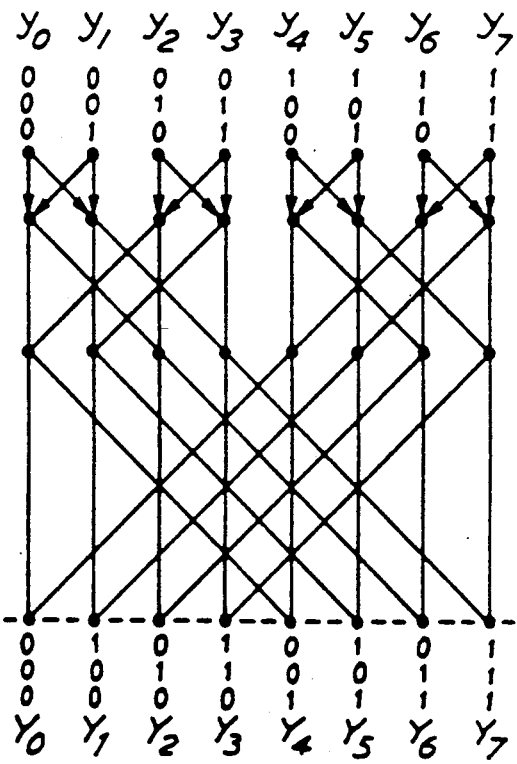

A numerical method for evaluation of this last expression given the ordered pairs $[x_i, v_i]$ is the Fast Walsh Transform (FWT), which is analogous to the Fast Fourier Transform (FFT). The FWT has the same signal flow pattern as the FFT with the exception that all complex "twiddle" factors are replaced by either +1 or −1 so that multiply-add operations become simple add or subtract operations. The basic transformation is the product $$Y = W_N y$$

where y is the $N \times 1$ vector to be transformed. The inverse transform is the same form, $$y = \frac{1}{N} W_N Y$$

except for the scale factor 1/N. The signal flow for the transformation is shown in FIGS. 5 a, b and c for N=2, 4 and 8, respectively. The extension to larger Ns is implicitly clear. When two points are combined to the right, the right one is subtracted from the left one, and when combined to the left, the two points are added. Note that the indices of the transformed data are in bit reversed order, as in the case of many FFT algorithms, e.g., $Y_{100}$ interchanged with $Y_{001}$, etc. See Yuen, WALSH FUNCTIONS AND GRAY CODE, from "Applications of Walsh Functions,"1971 proceedings, edited by R.W. Zeek and A E. Showalter, and references cited therein, which is incorporated by reference herein.

The FWT obtains in $N\log_2 N$ add-subtract operations the coefficients for the $\alpha_k$ vector. Having obtained the $\alpha_k$ vector, f{b} may then be acquired from $$f\{b\} = \frac{1}{N} \sum_{k=0}^{N-1} a_k \psi_b(k)$$

Implementation of this expression for f{x} suggests the structure shown in FIG. 4. It is assumed that the $\alpha_k$ vector has been determined. The input signal, x, is first applied to quantizer 10, which quantizes the input signal into q bits, $b_q b_{q-1}...b_1$, i.e, the b-vector is then applied to WEX network 12 (described in detail below) which produces at its N outputs the $\Psi_b(k)$ vector. The $\Psi_b(k)$ vector is then applied to $\alpha_k$ weighting network 14. It should be noted that since the $\Psi_b(k)$ vector only takes on values of +1 or −1, add-subtract operations replace the multiplications implied by the weighting process, which significantly simplifies implementation of the method. $\alpha_k$ weighting network 14 forms at its output the set of scalar products

{

A linear combination of the scalar products is then formed, for example, by summing junction 16 to form $$f(b) = \frac{1}{N} \alpha^T \psi(b)$$

The nature of WEX network 12 follows from the nature of the Walsh functions. Each set of binary rank Walsh functions constitute a group that is closed under multiplication, i.e., $$\Psi_i(j) \cdot \Psi_k(j) = \Psi_{i \oplus k}(j) = \Psi_i(i \oplus k)$$

where i⊕k represents the bit-by-bit modulo-2 addition of the binary bit representation of i and k. For example, if i=0101 and k=1100, i⊤k=1001. (Note that $\Psi_i(j) \cdot \Psi_i(j) = \Psi_o(j) = +1$. As will be shown, the function of the WEX network 12 corresponds to the bit-by-bit exclusive-or (EOR) operation on i and k. Hence the designation Walsh Exclusive Or (WEX) network.

Closure implies that any Walsh function of arbitrary order within a group of rank N Walsh functions may be generated exclusively from the binary order Walsh functions, and more specifically from the bit pattern of b, the input b-vector, where $$b = (b_q b_{q-1} \ldots b_1), b_i = \begin{cases} 1 \\ 0 \end{cases}$$

describes the state of the $\Psi_b(k)$ vector at k=1, 2, 4, ..., $2^{q-1}$ as follows $$\Psi_b(2^i) = b_{q-i}, i=0, 1, 2, ..., q-1$$

From this knowledge, and recognizing that $$\Psi_b(k) = \Psi_{b_q b_{q-1}...b_1}(k), b = b_q b_{q-1}...b_1$$

$$\Psi_b(k) = \Psi_{b_q 00...0}(k) \cdot \Psi_{0 b_{q-1} 0...0}(k)...\Psi_{0...0 b_1}(k)$$

or equivalently $$\psi_x(k) = \psi_{2^{q-1}}^{b_q}(k) \cdot \psi_{2^{q-2}}^{b_{q-1}}(k) \ldots \psi_{2^1}^{b_2}(k) \cdot \psi_{2^0}^{b_1}(k)$$

because $$\psi_{2^p}^{b_{p+1}}(k) = \begin{cases} 1, & b_{p+1} = 0 \\ \psi_{2^p}, & b_{p+1} = 1 \end{cases}$$

For example, if x=13, then $$13 \longleftrightarrow 1101 = [b_4 b_3 b_2 b_1]$$

and $$\Psi_{13}(k) = \Psi_{1101}(k) = \Psi_{1000}(k) \cdot \Psi_{0100}(k) \cdot \Psi_{0001}(k)$$

also $$\psi_{13}(k) = \psi_{23}^1(k) \cdot \psi_{22}^1(k) \cdot \psi_{21}^0(k) \cdot \psi_{20}^1(k)$$

Further, at $k=2^{k_q-p}$, the binary order columns of $W_N$ are the binary order Walsh functions, $\{\Psi_{2p}(k)\}$, which assume values in accordance with $$\Psi_{2p}(k) = \Psi_{O...O b_{p+1} 1 O...o}(k) = (-1)^{k_q - p}$$

evaluated at $k=O...Ob_{q-p}O...O$, that is $$\psi_{2p}(k) = \psi_{0 \ldots 0 b_{p+1} 0 \ldots 0(k)}|_{k=0 \ldots 0 b_{q-p} 0 \ldots 0} = (-1)^{k_q - p}$$

Thus, $$\Psi_b(k) = (-1)^{k_q - 1 b_1} (-1)^{k_q - 1 b_2}...(-1)^{k_1 b_q}$$

or $$\Psi_b(k) = (-1)^{k_q b_2 \oplus k_q - 1 b_2 6 1 \ldots \oplus k_1 b_q}$$

For example, the fifteenth entry of the seventh row of $W_{16}$ (the 16th order Walsh matrix) would be $$\Psi_7(k) = \Psi_{0111}(k) = (-1)^{1 \cdot k_4 \oplus 1 \cdot k_3 \oplus 1 \cdot k_2 \oplus 0 \cdot k_1}$$

$$b = [0111] \longleftrightarrow 7$$

$$k = [k_4 k_3 k_2 k_1] = [1111] \longleftrightarrow 15$$

so that $$\Psi_7(15) = (-1)^{1 \oplus 1 \oplus 1 \oplus 0} = -1$$

Thus, we may conclude that the essential function of WEX network 12 is to perform a set of EOR operations on the input b-vector. In fact, the function of WEX network 12 is actually to form all possible combinations of the bits of the input. The WEX network 12 may include distinct structures for accomplishing each function. "Combinations" as used herein refers to permutations of groupings of the elements of the b-vector without regard to order.

With regard to notation, the standard symbology is used for the EOR operation. The truth tables for an EOR operation on 2 and 3 inputs is shown in Tables 1 and 2, respectively. Construction for larger numbers of inputs follows intuitively.

TABLE 1

(e.g., Signetics 7486)

| inputs | | output |
|---|---|---|
| A | B | X |
| 0 | 0 | 0 |
| 0 | 1 | 1 |
| 1 | 0 | 1 |
| 1 | 1 | 0 |

TABLE 2

(e.g., Signetics 74S135)

| inputs | | | output |
|---|---|---|---|
| A | B | C | X |
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

Figure 6:
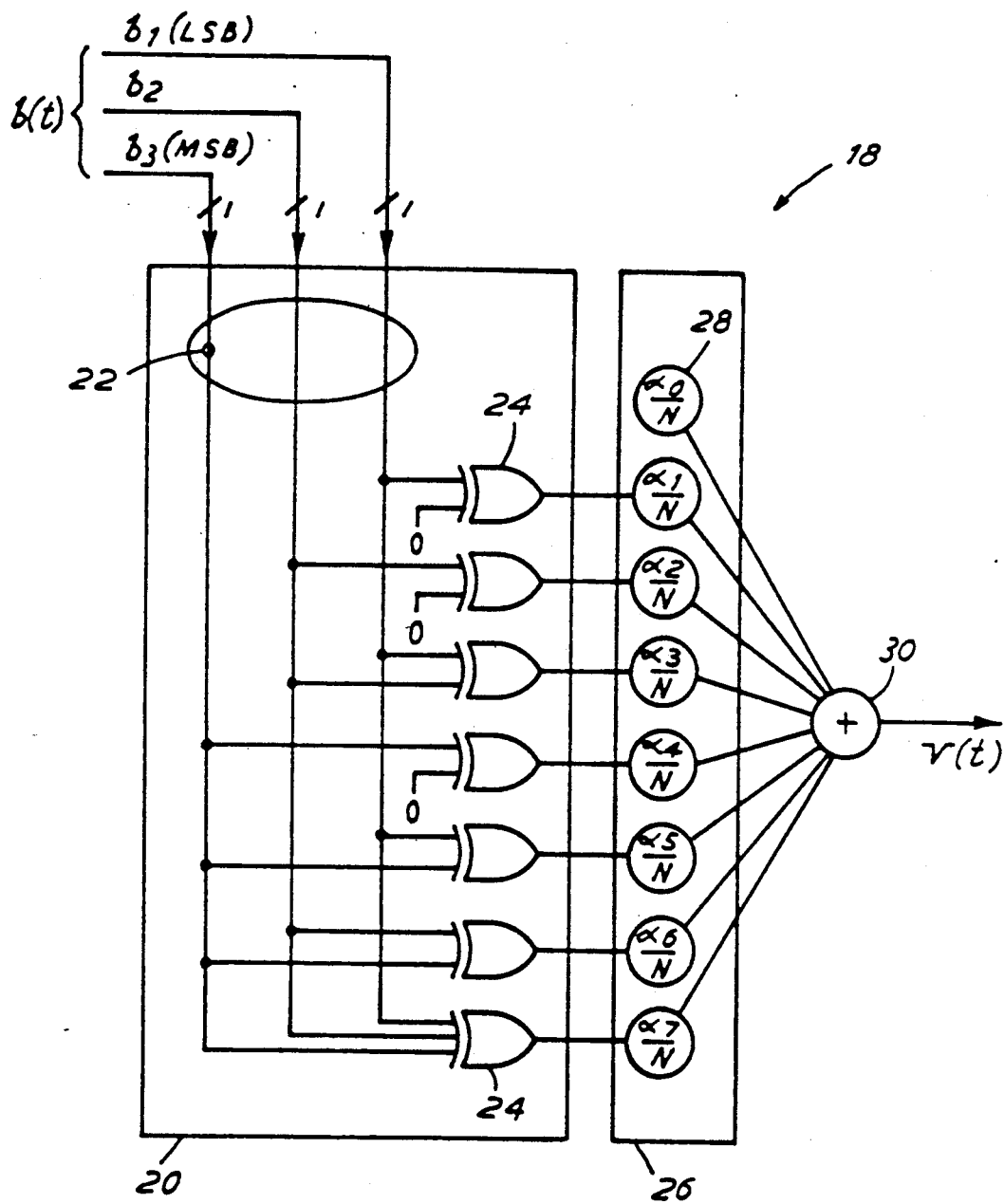
FIG. 6 shows a schematic diagram of a General Network model with q=3 elements of the b-vector.

As an example, consider FIG. 6, which is a schematic diagram of a General Network model, generally designated by reference numeral 18, of a network with $q=3$ elements of the b-vector. The b-vector comprises bits $b_3b_2b_1$ ($b_1$ being the LSB), so that three bit lines 22 lead into WEX network 20. The b-vector is applied to WEX network 20, which consists of a plurality of EOR gates 24. The maximum number of EOR gates that would be required is $2^q-1=2^3-1=7$, however, that number may be reduced as described in detail below. The outputs of the EOR gates correspond to the Walsh functions of order b, i.e. $\Psi_b(k)$. WEX network 20 is thus capable of forming the input bit pattern as well as all possible interactions between the bits comprising the b-vector.

A number of the EOR gates 24 are connected to only a single bit line 22. The unconnected inputs to each of these EOR gate 24 are allowed to float low, so that the EOR gate is asserted when the connected bit line is high, as if its associated weight 28 were directly connected to the bit line 22.

The output of the EOR gates 24 (i.e., the output of WEX network 20) forms the $\Psi(k)$ vector the $\alpha(k)$ vector is applied to the $\alpha_k$ weighting network 26. The $\alpha_k$ weighting network consists of a number of memory elements 28, each element corresponding to an element of the $\alpha_k$ vector. The maximum number of memory elements that would be required would be $2^q=2^3=8$, however, that number may be reduced as described in detail below. The value stored in each of memory elements 28 are summed by summing device 30 to form the scalar output, v, of the General Network model 18. When an EOR gate 24 is asserted (i.e., when it outputs a "true" value) the corresponding $\alpha_k$ weighting network element is negated so that the negative of the stored value is formed in the sum.

Alternatively, when an EOR gate 24 is asserted, the corresponding $\alpha_k$ weighting network element may be added into the sum. Only those $\alpha_k$ weighting network elements corresponding to asserted EOR gates contribute to the sum. This follows from the fact that the output of EOR gate 24 will generally be either "0" or "1", Assuming the convention that a "+" corresponds to "0" and a "−" corresponds to "1", from the Walsh matrices, the sum may be calculated from:

$$\sum_{k=0}^{N-1} \psi_b(k)\alpha_k = 2 \sum_{k=0}^{N-1} \frac{1}{2}[\psi_b(k) + \psi_b(0)]\alpha_k - \sum_{k=0}^{N-1} \alpha_k$$

Of course, it is a straight-forward modification of this approach to form the sum of those $\alpha_k$ weighting network elements corresponding to non-asserted EOR gates. The method chosen will depend on the particular application.

Figure 7:
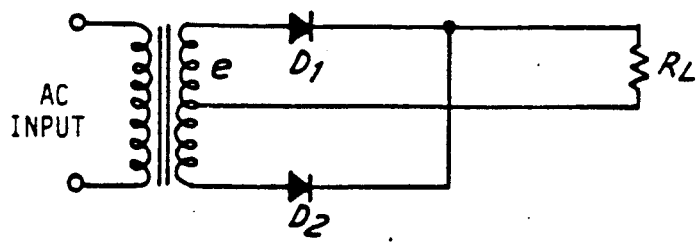
FIG. 7 shows a schematic diagram of a full-wave diode rectifier.
Figure 8A:
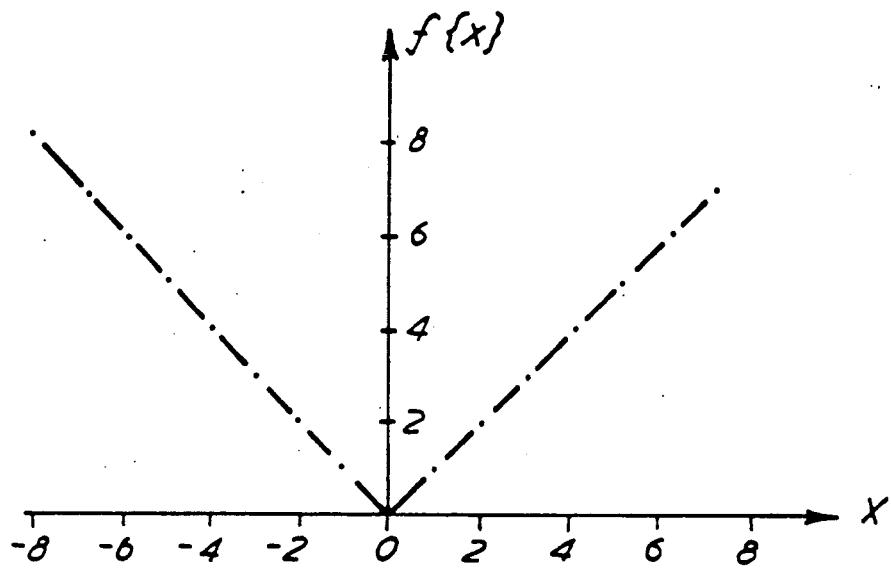
FIGS. 8a and b show the transfer characteristics of the full-wave rectifier shown in FIG. 7, in standard and normalized forms, respectively.

Consider, by way of example, the full-wave rectifier shown in FIG. 7, having the transfer characteristics shown in FIG. 8a. The range of values indicated includes 16 data points for $-8=x=7$. Thus, a 4-bit b-vector is selected. If two's complement code is used to represent the data from FIG. 8a, we arrive at the values shown in Table 3.

TABLE 3

| Input value | −8 | −7 | −6 | −5 | −4 | −3 | −2 | −1 | 0 | 1 | 2 | 3 | 4 | 5 | 6 | 7 |
|---|---|---|---|---|---|---|---|---|---|---|---|---|---|---|---|---|
| Input code (MSB) | 1 | 1 | 1 | 1 | 1 | 1 | 1 | 1 | 0 | 0 | 0 | 0 | 0 | 0 | 0 | 0 |
|  | 0 | 0 | 0 | 0 | 1 | 1 | 1 | 1 | 0 | 0 | 0 | 0 | 1 | 1 | 1 | 1 |
|  | 0 | 0 | 1 | 1 | 0 | 0 | 1 | 1 | 0 | 0 | 1 | 1 | 0 | 0 | 1 | 1 |
| (LSB) | 0 | 1 | 0 | 1 | 0 | 1 | 0 | 1 | 0 | 1 | 0 | 1 | 0 | 1 | 0 | 1 |
| State b | 8 | 9 | 10 | 11 | 12 | 13 | 14 | 15 | 0 | 1 | 2 | 3 | 4 | 5 | 6 | 7 |
| Output value | 8 | 7 | 6 | 5 | 4 | 3 | 2 | 1 | 0 | 1 | 2 | 3 | 4 | 5 | 6 | 7 |

Figure 8B:
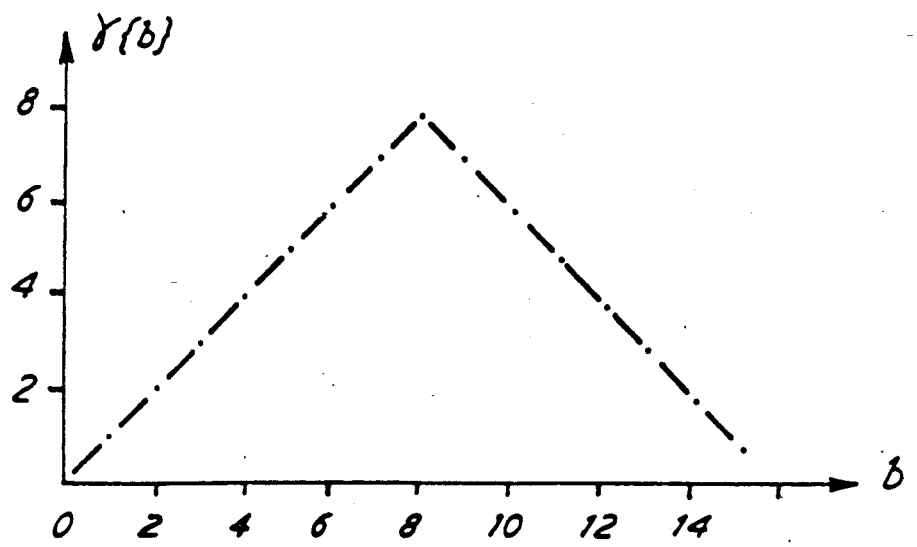

The row labelled "State b" is a positive integer ranging over $N=16$ values, 0 to 15, corresponding to the unipolar binary code interpretation of the input code. This transformation to "State b" is a convenience which normalizes the range of the input so that its domain spans from 0 to $N-1$. This causes $f\{x\}$ to be remapped as $\gamma\{b\}$ as shown in FIG. 8b.

The values for $\alpha_k$, $0 \leq k \leq N-1$, , may be obtained from the standard expression for the Walsh transform of $f\{b\}$ discussed above, namely, $$\alpha_k = \sum_{b=0}^{N-1} f\{b\}\psi_k(b)$$

An FWT performed on $f\{b\}$ yields the values for $\alpha_k$ as a function of k shown in Table 4.

TABLE 4

| k | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| $\frac{1}{N}\alpha$ | 4 | −.5 | 0 | −2 | 0 | −1 | 0 | 0 | 0 | −.5 | 0 | 0 | 0 | 0 | 0 | 0 |

Figure 9:
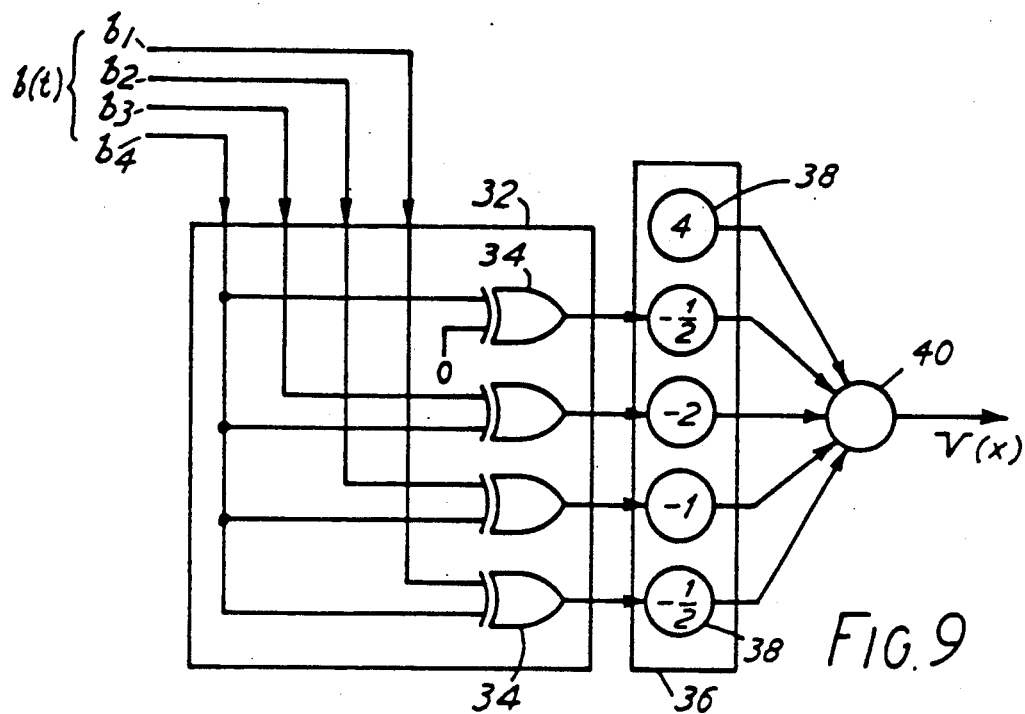
FIG. 9 shows the General Network model for the full-wave rectifier shown in FIG. 7.

This provides all of the necessary information needed to synthesize the General Network equivalent to the full wave rectifier. The resulting General Network model for the full wave rectifier is shown in FIG. 9, where the output, f{b}, is, in vector notation $$f\{b\} = \frac{1}{N} W_N \alpha$$

Analogous to FIG. 6, the General Network model includes WEX network 32. Since the Walsh transform of f{b} resulted in a value of 0 for several of the $\Psi_b(k)$, there is no need to include an EOR gate in WEX network 32 for the corresponding $\Psi_b(k)$. This results in a total of four EOR gates 34 for the General Network model. Likewise, the General Network model includes $\alpha_k$ weighting network 36, which holds the non-zero $\alpha_k$ values in memory elements 38. The value stored in each of memory elements 38 are summed by summing device 40 to form the scalar output, v, of the General Network model, with the content of a memory element 38 negated when the b input results in an asserted corresponding EOR gate 34.

The fact that the General Network model is accurate for the given inputs can be verified from Table 5.

TABLE 5

| x | b (MSB) | | | (LSB) | GN output (v) | f{x} |
|---|---|---|---|---|---|---|
| −8 | 1 | 0 | 0 | 0 | 4 + .5 + 2 + 1 + .5 = 8 | 8 |
| −7 | 1 | 0 | 0 | 1 | 4 + .5 + 2 + 1 − .5 = 7 | 7 |
| −6 | 1 | 0 | 1 | 0 | 4 + .5 + 2 − 1 + .5 = 6 | 6 |
| −5 | 1 | 0 | 1 | 1 | 4 + .5 + 2 − 1 − .5 = 5 | 5 |
| −4 | 1 | 1 | 0 | 0 | 4 + .5 − 2 + 1 + .5 = 4 | 4 |
| −3 | 1 | 1 | 0 | 1 | 4 + .5 − 2 + 1 − .5 = 3 | 3 |
| −2 | 1 | 1 | 1 | 0 | 4 + .5 − 2 − 1 + .5 = 2 | 2 |
| −1 | 1 | 1 | 1 | 1 | 4 + .5 − 2 − 1 − .5 = 1 | 1 |
| 0 | 0 | 0 | 0 | 0 | 4 − .5 − 2 − 1 − .5 = 0 | 0 |
| 1 | 0 | 0 | 0 | 1 | 4 − .5 − 2 − 1 + .5 = 1 | 1 |
| 2 | 0 | 0 | 1 | 0 | 4 − .5 − 2 + 1 − .5 = 2 | 2 |
| 3 | 0 | 0 | 1 | 1 | 4 − .5 − 2 + 1 + .5 = 3 | 3 |
| 4 | 0 | 1 | 0 | 0 | 4 − .5 + 2 − 1 − .5 = 4 | 4 |
| 5 | 0 | 1 | 0 | 1 | 4 − .5 + 2 − 1 + .5 = 5 | 5 |
| 6 | 0 | 1 | 1 | 0 | 4 − .5 + 2 + 1 − .5 = 6 | 6 |
| 7 | 0 | 1 | 1 | 1 | 4 − .5 + 2 + 1 + .5 = 7 | 7 |

It should be noted that the net result of the WEX network is to generate one or more sets of negate instructions. Each set of negate instructions corresponds to a Walsh function.

The method described above involves utilization of a preprogrammed series of EOR gates which are capable of producing all possible interactions of the input bits. The sets of negate instructions can quickly be determined from reference to a Walsh matrix like those shown in FIGS. 3a, b and c. For example, to determine the output state of the WEX for $\Psi_5(7)$, reference can be made to the Walsh matrix shown in FIG. 3c. From this, it is determined that the value for $\Psi_5(7)$ is "+", or 0 (remembering that the output of the WEX is in binary form, and adopting the convention that a "+" represents a logic 0 state and a "−" represents a logic 1 state). Thus, the hard-wired WEX network may be replaced by a Walsh matrix of appropriate rank, stored in a look-up table or the like.

Figure 10:
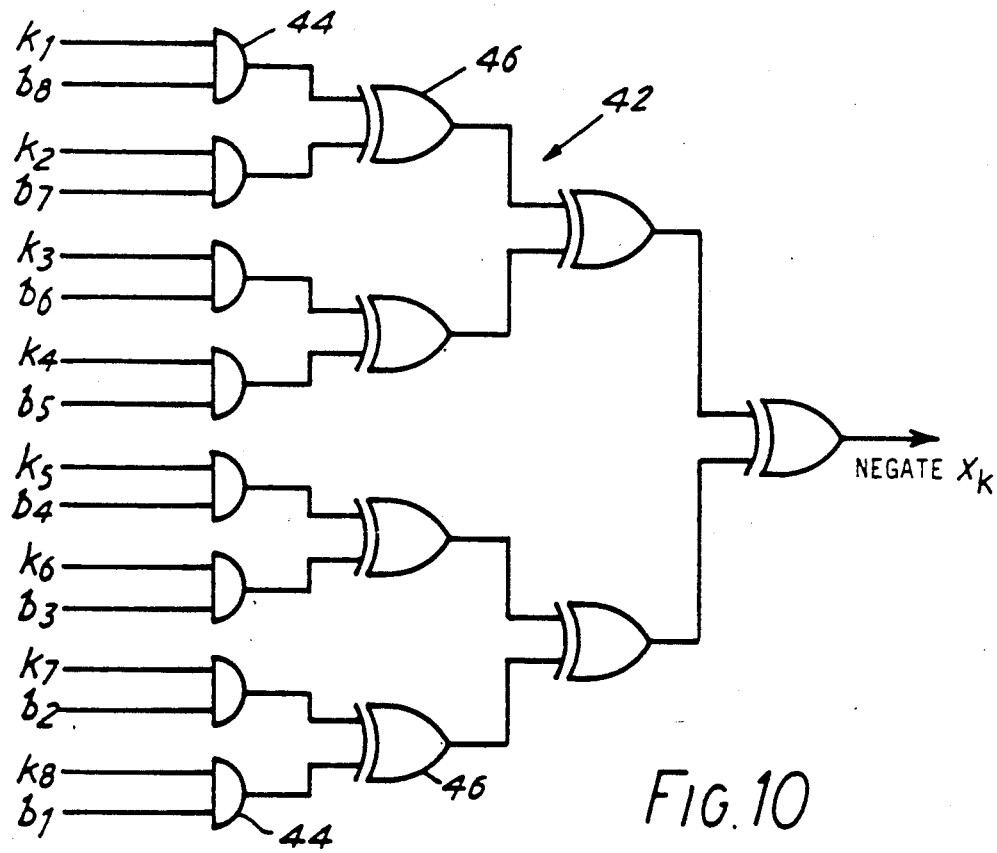
FIG. 10 shows a Negate Logic apparatus used to generate the output of a WEX network.

Alternatively, the calculations of $\Psi_b(k)$ may be done sequentially. The Negate Logic apparatus 42 shown in FIG. 10 allows generation of the outputs of a WEX network without requiring the preprogramming of the EOR gates. The Negate Logic apparatus 42 shown in FIG. 10 is for $N = 2^q = 2^3 = 8$ (i.e., q=3). The Negate Logic apparatus 42 consists of a plurality of AND gates 44 and EOR gates 46 connected in a reducing network, with the b and k values as inputs. In order to determine the value of $\Psi_b(k)$ for a particular b and k value, the binary value of b is applied to AND gates 44. Likewise, the binary value of k is applied to the AND gates 44, but in reversed order to that of b. The resulting output, NEGATE $\alpha_k$, will represent the output of the corresponding EOR gate from the WEX network.

Thus far, the problem of synthesizing a non-linear function $$x(t) = f\{x(t)\}$$

has been approached in a manner that implies a no-memory operation on a single channel signal, x(t). In fact, in the most general case, the no-memory, single channel limitation is inappropriate since a properly defined x(t) may be generalized to include such features as:

1. Input history (memory) dependency;
2. Feedback dependency; and
3. Multi-channel inputs.

The output of many, if not most, practical networks exhibit a dependency on present and past input values due to either reactive (capacitive inductive etc.) analog elements or explicit memory elements imbedded in the structure. Linear as well as non-linear interactions may occur between prior and present input values. Feedback dependency may also occur, often creating memory dependencies on the infinite past of input and output states. Also, multiple inputs often include not only the primary signal(s) but also environmental effects and control signals. By appropriately defining the General Network model, the most general features of the network may be synthesized and modelled.

Again, let b(t) represent the quantized values of the input vector, x(t). If the input time-varying bit pattern is defined to be a field of time-varying bits, b(t), composed of words, {b(t,i)}, so that $$b(t) = [b(t,1)b(t,2)...b(t,m)]$$

where $$b(t,i) = [b_1(t)b_2(t)...b_q(t)]$$

and $$b_{ki} = \begin{cases} 1 \\ 0 \end{cases}$$

then b(t) is a composite "number" containing all of the essential input data. In other words, if the composite input, b(t), is applied to a WEX network, replicas of the original bit pattern as well as "bits" corresponding to all of the non-linear interactions of these data bits will be produced.

The number of possible output taps, N, from the WEX network determines the complexity of the model. N increases exponentially with the number of bits in the field of b(t). That is, $$N = 2^{\Sigma_i q_i}$$

This complexity is a consequence of the generality of the model and follows from the composite nature of the input, b(t).

Figure 13:
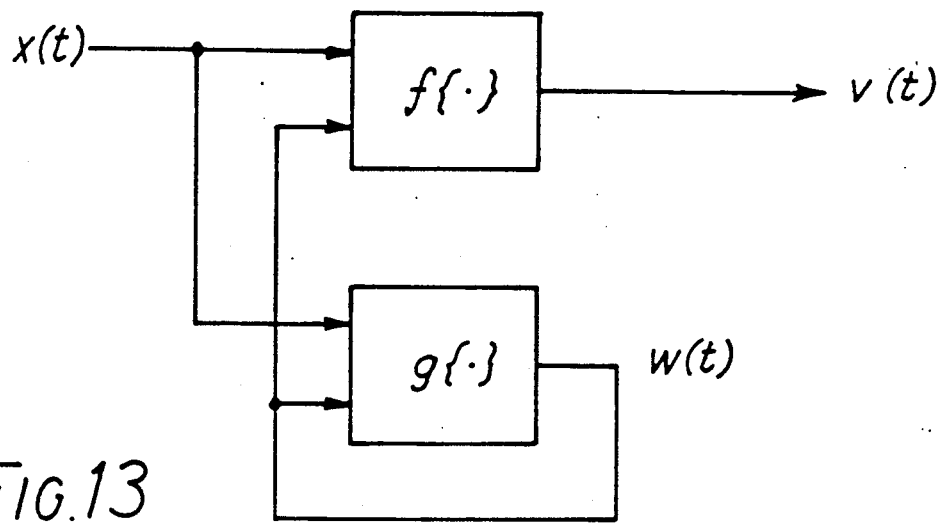
FIG. 13 shows a model of a network having memory, feedback and feedforward elements.

FIG. 13 shows a generalized model of a network having a specified relationship between input signals and output signals which includes feedback and feedforward, and which may include non-linear responses to multi-channel inputs. The relationship between input and output for this model is defined as $$v(t) = f\{x(t), g\{x(t), w(t)\}\}$$

As before, the input signals may be digital, analog or a combination of digital and analog, depending on the specific application of the present invention. Likewise, the output signals, v(t), may be digital or analog as needed. (The convention of referring to x(t) as x, b(t) as b and v(t) as v will be repeated here, as above).

Figure 14:
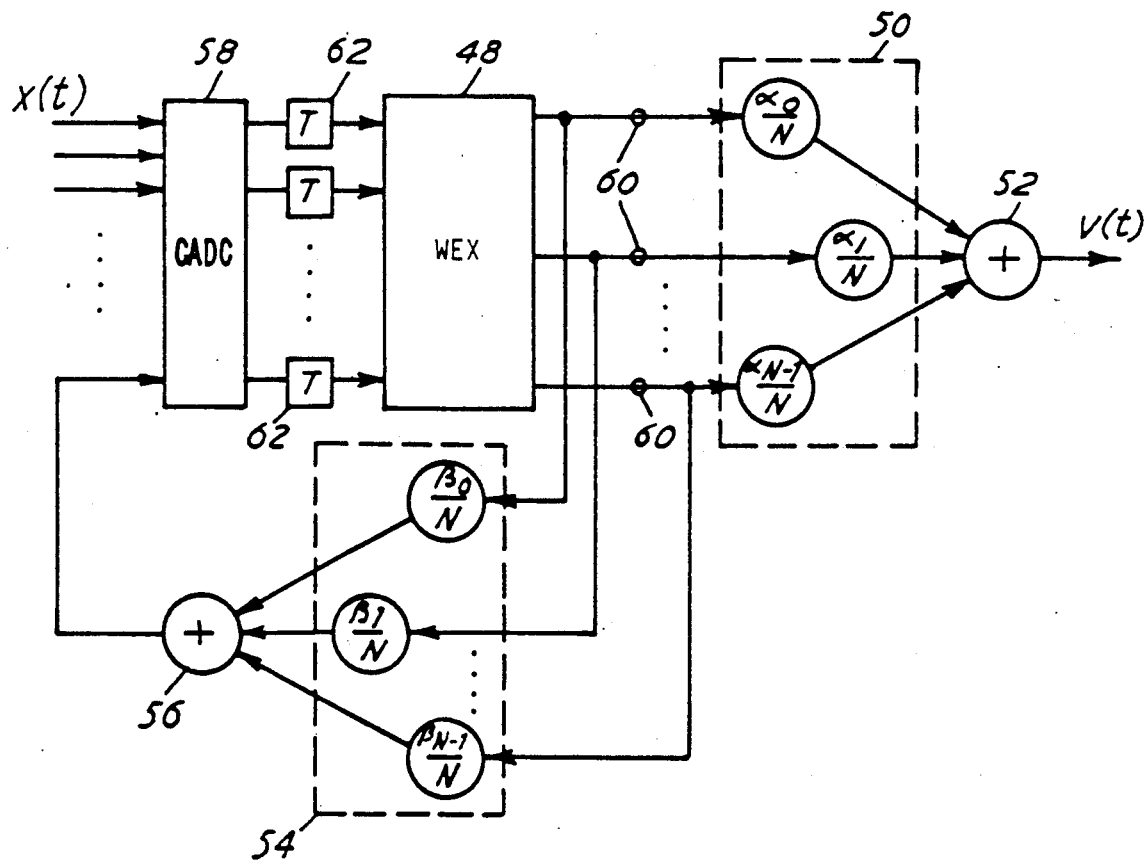
FIG. 14 shows the structure for the General Network modeling of the network shown in FIG. 13.

Implementation of this expression for f{.} suggests the structure shown in FIG. 14. The underpinnings of the structure are similar to that shown in FIG. 4. That is, present in this General Network model is WEX network 48, $\alpha_k$ weighting network 50 and summing junction 52. However, because of the requirement that the model be capable of representing feedback and feedforward inputs, a second weighting network, $\beta_k$ weighting network 54 has been added along with a corresponding summing junction 56. The input signal, x(t) is applied to a quantizer 58 to produce quantized signals which, via tapped delay lines 62, may be applied to WEX network 48 whose output is the N values of the $\Psi_b(k)$ vector.

The output of WEX network 48 may be fed back to its inputs so that its inputs may consist of a combination of x(t), all or parts of its own output, and delayed replicas of each. Tapped off of the N outputs of WEX network 48 are bit-lines 60 which apply the output signals from WEX network 48 to the $\beta_k$ weighting network. The weighting of the output signals of WEX network 48 is accomplished by add-subtract operations, due to the $+1/-1$ nature of its output. The $\beta_k$ weighting network forms at its output the scalar product $$\frac{1}{N} \beta_k \Psi_b(k)$$

A linear combination of the scalar products is then formed by, for example, summing junction 56. The linear combination is then input to WEX network 48 as the feedback portion of its input.

The N outputs of WEX network 48 on bit-lines 60 are also applied to the $\alpha_k$ weighting network 50. Again, the weighting of the output of WEX network 48 is accomplished by add-subtract operations as discussed above. The $\alpha_k$ weighting network forms at its output the scalar product $$\frac{1}{N} \alpha_k \Psi_b(k)$$

A linear combination of the scalar products is then formed by, for example, summing junction 52, to form f{.}.

In general, the precise nature of f{.} may not be known explicitly. However, a reference model may be used to observe the input/output behavior as a means of synthesizing a General Network model with the behavior of f{.}.

If v is the reference model output and b corresponds to its total input (again, b is the quantized bit vector of the WEX input), the design or synthesis process requires estimating the vector $\alpha$ corresponding to an approximated output v so that the General Network output, v, minimizes some error criterion such as the mean square error $$\epsilon_v^2(t) = \overline{[v(t) - v(t)]^2}$$

where the over-bar represents time averaging.
The solution for $\alpha$ is $$\alpha = [\Psi_{b(t)} \cdot \Psi_{b(t)}^T]^{-1} \cdot [\Psi_{b(t)} \cdot v(t)]$$

The weighting vector, $\alpha$, is the product of the inverse covariance matrix of the WEX output vector, $\Psi_{b(t)}(k)$, and the time averaged cross-correlation vector of the output vector $\Psi_{b(t)}$ and the desired scalar output, v(t).

In the feedback case, the weighting vector, $\beta$, must satisfy a similar condition:

$$\beta = [\Psi_{b(t)} \cdot \Psi_{b(t)}^T]^{-1} \cdot [\Psi_{b(t)} \cdot w(t)]$$

where $$\epsilon_w^2(t) = \overline{[w(t) - w(t)]^2}$$

where w(t) is the component of b(t) corresponding to the feedback signals. Alternatively, g{.} may be synthesized by a separate General Network model with x(t) and w(t) as the inputs and w(t) as the output.

If an exact complete behavioral model is required, two conditions must be met:
1. The degrees of freedom (DOF) of the General Network must equal or exceed the DOF of the reference model; and
2. Sufficient variety is required in b(t) to ensure the excitation of all states of the reference model.

DOF in bit units is measured by the number of bits required at the input to the WEX provided that the requisite variables and delays are adequately represented in the vector, b. For example, consider the full-wave rectifier shown in FIG. 7 and described above. The system has four inputs, each with a binary state, resulting in 16 DOF. If sufficient DOF are not included in the model, more than one value of output may occur for a given input vector b. Averaging these values will result in a best (least mean square error) reduced DOF model of the network.

For a narrowly defined model, i.e., one that has a specified behavior for a limited variety of input signals, a simpler model of lower DOF may result. For example, should it be desired to synthesize the network behavior of an amplifier which only operates below saturation, and hence the General Network model be valid only below saturation, there is no need to have response values for the amplifier above saturation. This would result in a fewer number of possible inputs and, hence, fewer DOF. Although the resulting model may not characterize the amplifier network for all input levels (the model would not be accurate at or above saturation), it may nonetheless be accurate for inputs below saturation.

If a network is "noisy" the network may have more than a single output for each input. When such is the case, an "averaged" output vector may be produced from the observed outputs to model the system, i.e., a time-average of the outputs is used to minimize the mean square error $$\epsilon_v^2(t) = [v(t) - \hat{v}(t)]^2$$

and $$\epsilon_w^2(t) = [w(t) - \hat{w}(t)]^2$$

If the input and output data are sampled, a "fast" (highly efficient) algorithm may be used to extract the $\alpha$ and $\beta$ weighting vectors that takes the form:

$$\alpha = W_N \cdot \gamma$$

where $$\gamma = [\Lambda^{-1} W_N \Psi_{b(n)}] \cdot v(n)$$

$$\Lambda = \text{Diag}[\lambda_0 \lambda_1 \ldots \lambda_{n-1}]$$

$$W_N = [\Psi_0 \Psi_1 \ldots \Psi_{N-1}]^T$$

and $\lambda$ is the ith eigenvalue of $$\Psi_{b(n)} \cdot \Psi_{b(n)}^T$$

corresponding to the ith eigenvector $\Psi_i$ and it is equal to the value of the output each time that $\Psi_i$ occurs. Note that this expression for $\alpha$ is of the same form as that previously derived for the simple one variable no memory non-linearity, namely $$\alpha = W_N f$$

where f is the representation of the non-linearity as a function of b (f=f{b}).

$$f\{b\} = \frac{1}{N} W_N \alpha$$

From which we conclude that $$\gamma(b) = f\{b\}$$

where f{b} has been generalized to include the no-memory, single-variable as a special degenerate case. The N×1 vector, $\gamma$, may be formed, in the case of a deterministic (noiseless) system, by ordering the value of the output, v(t), as a function of b. In other words, $$\gamma = f\{b\}, \ b=0, 1, 2, \ldots, N-1$$

For each input code, b, one and only one value of v results so that $$v(b) = f\{b\} = \gamma$$

This operation may be done "on the fly" as a data acquisition procedure without any substantial penalty in processing time.

Figure 15:
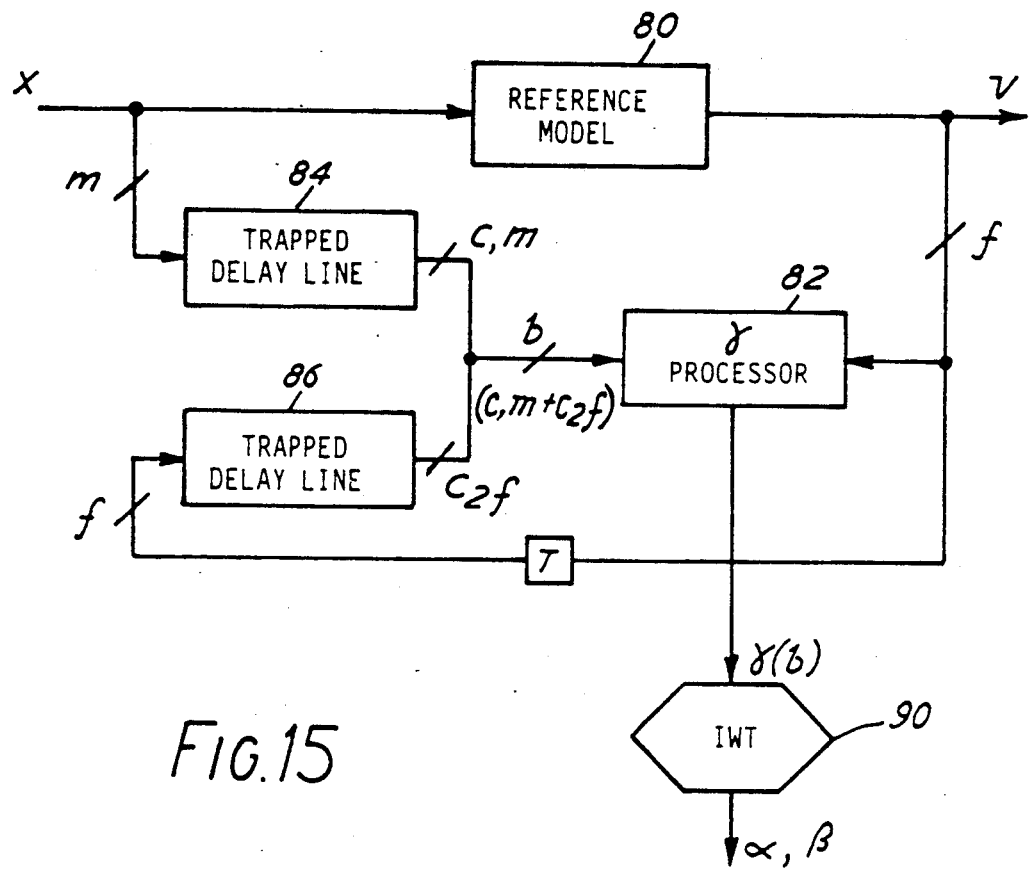
FIG. 15 shows a device for determining the $\gamma$ vector during a data acquisition procedure.

For example, FIG. 15 shows a device capable of producing the intermediate vector, $\gamma$, as part of a data acquisition procedure. Input signal x is applied to the reference model 80, whose output v is in turn applied to $\gamma$ processor 82. Simultaneously, input signal x is applied to tapped delay line 84 so that input signal x may be synchronously applied to $\gamma$ processor 82 with the output v of reference model 80. Likewise, the output v of reference model 80 is applied to a tapped delay, line 86 so that it too may be synchronously applied to $\gamma$ processor 82, in the form of feedback. The inputs to $\gamma$ processor 82 are thus the b vector and the reference model response v. From these inputs, $\gamma$ processor 82 produces the intermediate vector, $\gamma$.

The final operation is an inverse Walsh transform IWT 90, that forms $\alpha$ or $\beta$ from $W_N$ and and which takes approximately $N\log_2 N$ add/subtract operations. Hence, synthesis requires a modest amount of processing, proportional to $N\log_2 N$ simple operations.

It should be noted that in circumstances where there are multiple input channels, a number of parallel $\alpha$ and/or $\beta$ vectors may be required. Calculation of these parallel $\alpha$ and/or $\beta$ vectors is as previously discussed, and the hardware is unchanged apart from the added storage space required by the additional coefficients.

Occasionally it will occur that the intermediate vector will contain one or more undetermined coefficients. This results from having a smaller number of possible excitation states of the Network than degrees of freedom of that network allows. When this happens, the undetermined coefficients can take on any value selected, and may be used to minimize or maximize certain aspects of the resulting General Network model. An example demonstrates this.

Figure 11A:
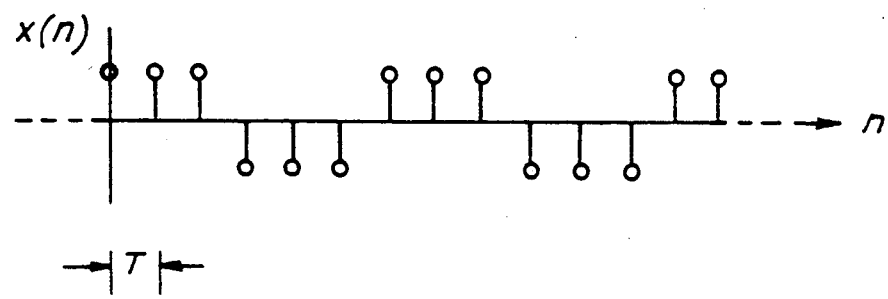
FIGS. 11a and b show the input and response sequence, respectively, of a filter used to demonstrate the modeling and synthesis of a General Network.
Figure 11B:
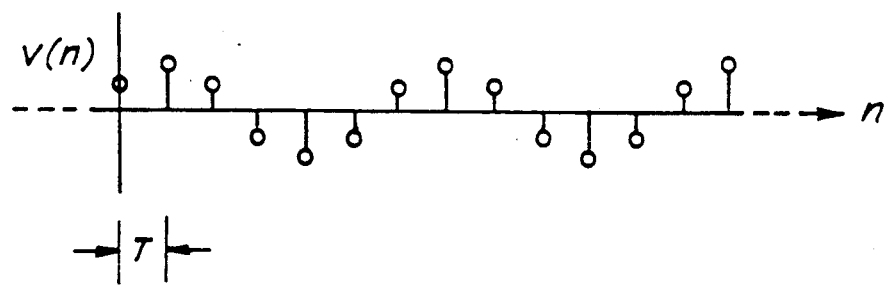

It is desired to synthesize a filter given the periodic input sequence, x(n), and the response sequence, v(n), as shown in FIGS. 11 a and b, respectively. The input is a sampled "square" wave while the output is a sampled sinusoid corresponding to $$v(n) = \sin\left(n + \frac{1}{2}\right)\frac{\pi}{3}$$

A feedforward model with two delay elements, T, is selected. The minimum b-vector, formed such that "+" corresponds to "0" and "−" corresponds to "1", $$b(n) = \begin{bmatrix} x(n) \\ x(n-1) \\ x(n-2) \end{bmatrix} = \begin{bmatrix} + & + & + & - & - & - \\ - & + & + & + & - & - \\ - & - & + & + & + & - \end{bmatrix} = [3\ 1\ 0\ 4\ 6\ 7]$$

The corresponding values of v(n) are $$v(n) = [0.5\ 1\ 0.5\ -0.5\ -1\ -0.5] = 0.5[1\ 2\ 1\ -1\ -2\ -1]$$

The intermediate coefficient vector, $\gamma$, is constructed by re-ordering v(n) in ascending order of the values of b $$b = [0\ 1\ 2\ 3\ 4\ 5\ 6\ 7]$$

$$\gamma = 0.5[1\ 2\ \theta\ 1\ -1\ \theta\ -2\ -1]$$

where $\theta$ implies an undetermined coefficient (resulting from the requirement of two input delays so that x(n), x(n−1) and x(n−2) constitute a three bit b-vector implying $N=2^3=8$ degrees of freedom, but only 6 unique output constraints exist (0.5, 1, 0.5, −0.5, −1, −0.5)). This implies a large set of solutions of which two are shown, one in FIG. 12a for $\theta=0$, and one in FIG. 12b for $\theta=2, -2$.

For =0, we solve for $$\frac{1}{N} \alpha = \frac{1}{N} W_N \gamma$$

to obtain $$\frac{1}{8} \alpha = \frac{1}{4} [0\ 2\ 1\ 0\ -1\ 0\ 0\ 0]^T$$

Figure 12A:
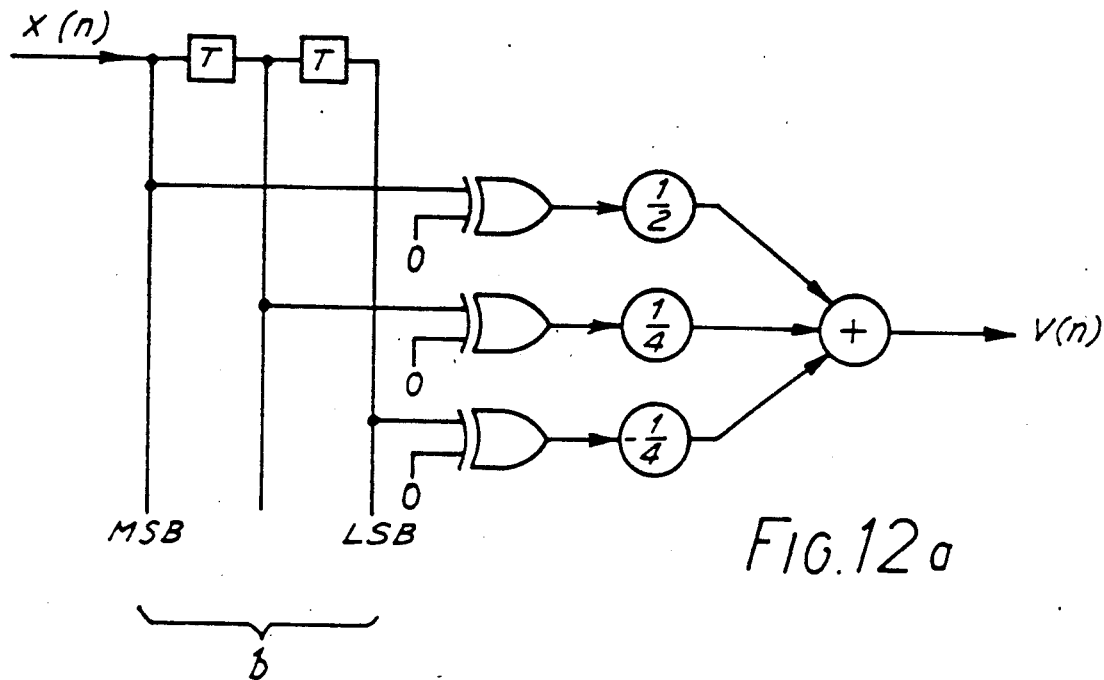
FIGS. 12a and b show the General Network models for the filter having the input and response sequences shown in FIGS. 11a and b, for $\theta=0$ and $\theta=2,-2$, respectively.

The resulting General Network model is shown in FIG. 12a. It is noted that this results in a total of three connections of the bit lines to three two-input EOR gates. Further, three $\alpha_k$ weighting values must be stored.

For $\theta = 2, -2$, we solve for $$\frac{1}{N} \alpha = \frac{1}{N} W_N \gamma$$

to obtain $$\frac{1}{8} \alpha = \frac{1}{4} [0\ 3\ 0\ 0\ 0\ 0\ 0\ -1]^T$$

Figure 12B:
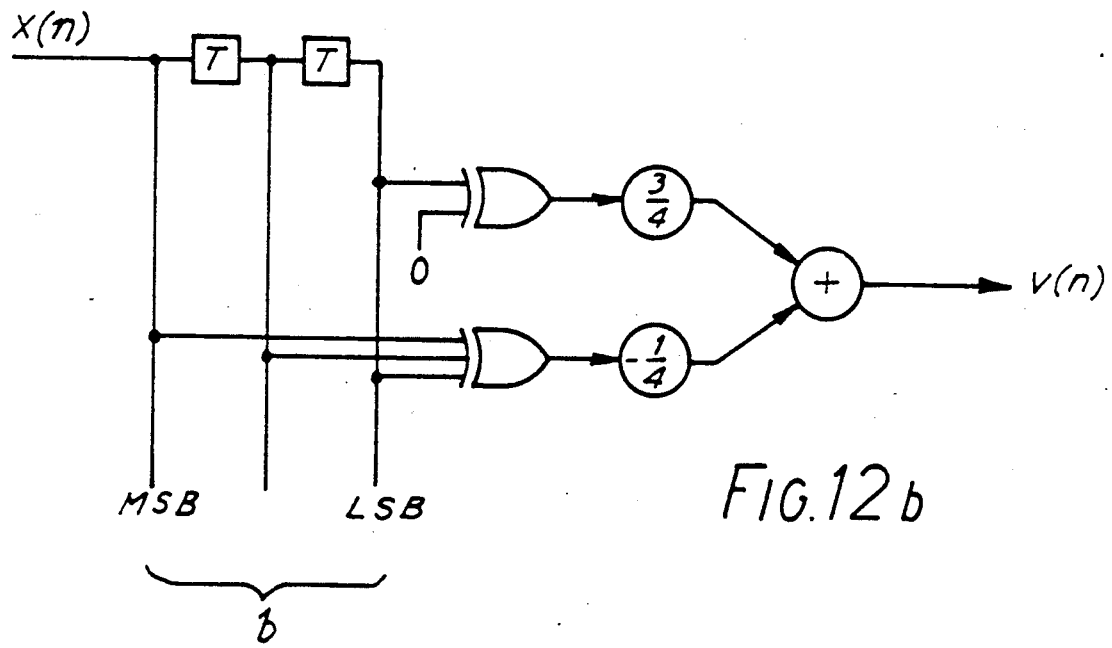

The resulting General Network model is shown in FIG. 12b. It is noted that this results in a total of four connections of the bit lines to two EOR gates, one a two-input EOR gate, and the other a three input EOR gate. Further, two $\alpha_k$ weighting values must be stored.

Comparing the resulting General Network models for $\theta = 0$ and for $\theta = 2, -2$, it is seen that each results in different numbers of connections to the bit lines, different types of EOR gates and different numbers of $\alpha_k$ to be stored. A system designer would be able to use this information to design a General Network model to optimize these parameters as needed or desired.

Figure 16:
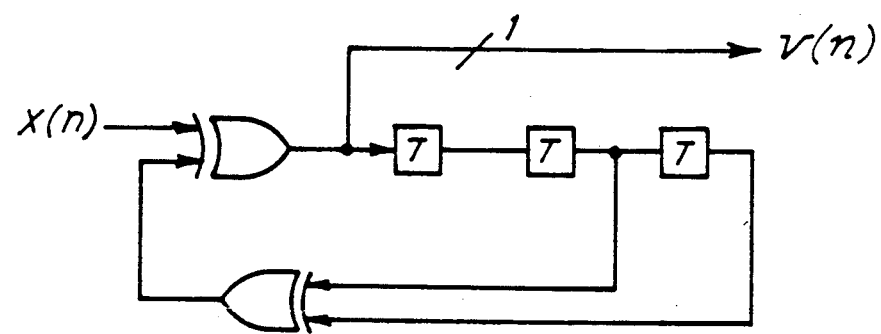
FIG. 16 shows the schematic diagram for a feedback shift register.
Figure 17:
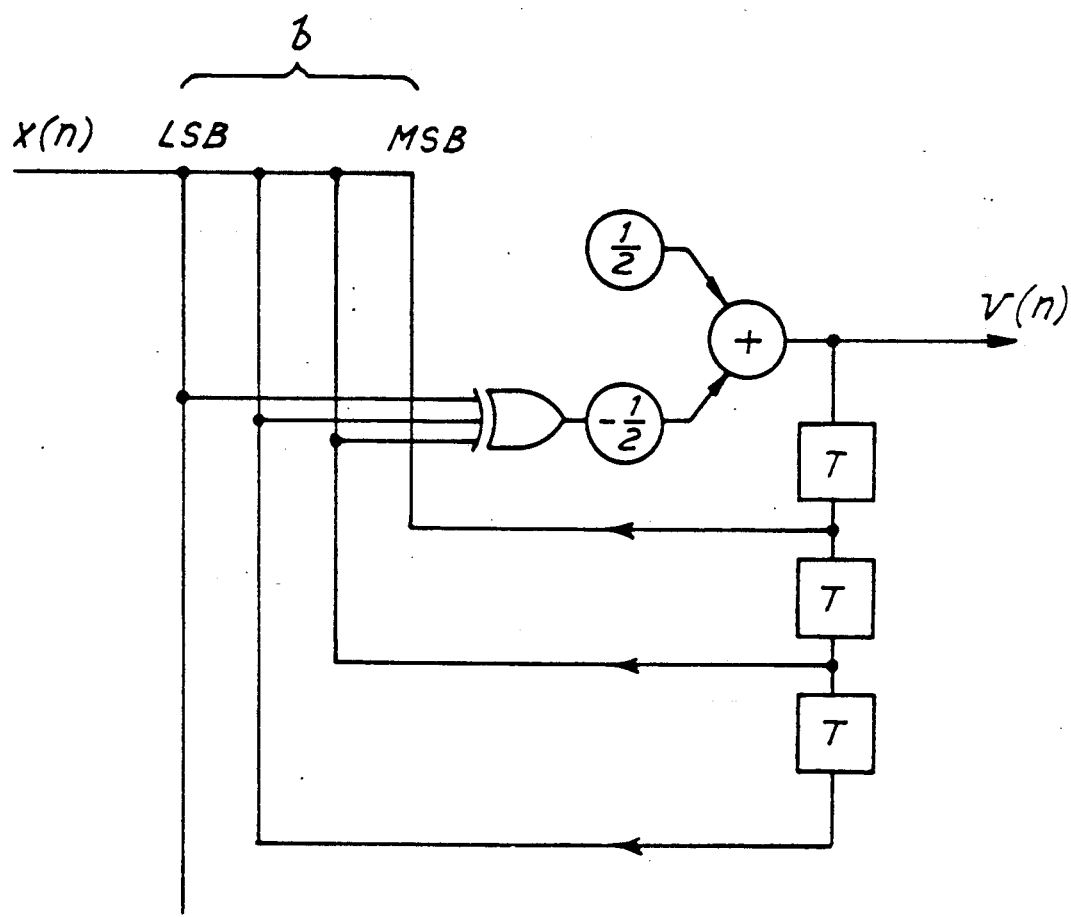
FIG. 17 shows a General Network model of the feedback shift register shown in FIG. 16.

As a further example, consider the feedback shift register (FSR) shown in FIG. 16. In FIG. 16, and subsequent Figs., the element labelled "T" indicates a delay element of one period of length T. Because the FSR is a feedback network, the feedback General Network model is chosen. The system has two different quiescent (or initial) states: x(n) and all memory states equal to "0", and x(n) and all memory states equal to "1". Thus, two cases are examined.

The first case analyzed is for x(n) and all memory locations set at "0". In order to feed back v(n), delay must be introduced. From FIG. 15 it is realized that a three delay model is required. This results in a construction of the b-vector as $$b(n) = \begin{bmatrix} v(n-1) \\ v(n-2) \\ v(n-3) \\ x(n) \end{bmatrix} = \begin{bmatrix} 0\ 0\ 1\ 0\ 1\ 1\ 1\ 0\ 0\ 1\ 1\ 0\ 1\ 0\ 0\ 0 \\ 0\ 0\ 0\ 1\ 0\ 1\ 1\ 1\ 1\ 0\ 0\ 1\ 1\ 0\ 1\ 0\ 0 \\ 0\ 0\ 0\ 0\ 1\ 0\ 1\ 1\ 1\ 0\ 0\ 1\ 1\ 0\ 1\ 0 \\ 0\ 1\ 0\ 0\ 0\ 0\ 0\ 0\ 1\ 1\ 1\ 1\ 1\ 1\ 1\ 1 \end{bmatrix}$$

which is rewritten as the following from the binary representation $$b(n) = [0\ 1\ 8\ 4\ 10\ 12\ 14\ 6\ 2\ 9\ 13\ 7\ 11\ 5\ 3\ 1]$$

with the resulting output $$v(n) = [0\ 1\ 0\ 1\ 1\ 1\ 0\ 0\ 1\ 1\ 0\ 1\ 0\ 0\ 0]$$

It should be noted that b(n) contained one duplicated value, 1, which for the present solution can be ignored or the corresponding responses averaged to provide a single N(h) to b(n) = 1 (i.e., b does not take on the value of 15). This will result in an indefinite value, $\theta$, in the $\gamma$ vector as shown below.

$$\gamma = [0\ 1\ 1\ 0\ 1\ 0\ 0\ 1\ 0\ 1\ 1\ 0\ 1\ 0\ 0\ \theta]^T$$

Turning to the second case, the initial conditions of the first case are complimented (i.e., x(n) and all memory locations are assumed to be "1"). This results in the values of the b-vector $$b(n) = \begin{bmatrix} v(n-1) \\ v(n-2) \\ v(n-3) \\ x(n) \end{bmatrix} = \begin{bmatrix} 1\ 1\ 0\ 1\ 0\ 0\ 0\ 1\ 1\ 0\ 0\ 1\ 0\ 1\ 1\ 1 \\ 1\ 1\ 1\ 0\ 1\ 0\ 0\ 0\ 1\ 1\ 0\ 0\ 1\ 0\ 1\ 1 \\ 1\ 1\ 1\ 1\ 0\ 1\ 0\ 0\ 0\ 1\ 1\ 0\ 0\ 1\ 0\ 1 \\ 1\ 0\ 1\ 1\ 1\ 1\ 1\ 1\ 0\ 0\ 0\ 0\ 0\ 0\ 0\ 0 \end{bmatrix}$$

which is rewritten as the following decimal valued integer vector from the binary representation $$b(n) = [15\ 14\ 7\ 11\ 5\ 3\ 1\ 9\ 13\ 6\ 2\ 8\ 4\ 10\ 12\ 14]$$

with the resulting output $$v(n) = [1\ 0\ 1\ 0\ 0\ 0\ 1\ 1\ 0\ 0\ 1\ 0\ 1\ 1\ 1\ 0]$$

Again, b(n) contained one duplicated value, 14, which for the present solution can be ignored or averaged as previously discussed, (i.e., b does not take on the value of 0). This will result in an indefinite value, $\theta$, in the $\gamma$ vector as shown below.

$$\gamma = [\theta\ 1\ 1\ 0\ 1\ 0\ 0\ 1\ 0\ 1\ 1\ 0\ 1\ 0\ 0\ 1]^T$$

Now, if the two cases are considered together to arrive at an "average" $\gamma$ vector the following is obtained $$\gamma = [0\ 1\ 1\ 0\ 1\ 0\ 0\ 1\ 0\ 1\ 1\ 0\ 1\ 0\ 0\ 1]^T$$

Using this "average" $\gamma$ vector yields, after the FWT and reordering $$\frac{1}{N} \alpha = \frac{1}{16} \alpha = \frac{1}{2} [1\ 0\ 0\ 0\ 0\ 0\ 0\ 0\ 0\ 0\ 0\ 0\ 0\ 0\ -1\ 0]^T$$

This results in the General Network model shown in FIG. 16.

In the absence of an input signal (x(n)=0) and if the initial state (content) of the delay elements were zero, this FSR would forever remain locked-up in this all-zero state. Similarly, if the input were to be x(n) = 1, and all initial memory states set to unity, the FSR would remain locked-up in this state. The unused DOF represented by 8 may be used to overcome this feature. For example, if the first b vector with $\gamma(15)$ undetermined were to be used with $\gamma 15) = 0$ for calculation of the $$\frac{1}{N} \alpha$$

vector it would yield $$\frac{1}{N} \alpha = \frac{1}{16} \alpha =$$

$$\frac{1}{16} [7\ 1\ 1\ -1\ 1\ -1\ -1\ 1\ 1\ -1\ -1\ 1\ -1\ 1\ -7\ -1]$$

or

-continued $$\frac{1}{16}\alpha = 1/2\,[1\,0\,0\,0\,0\,0\,0\,0\,0\,0\,0\,0\,0\,0\,-1\,0] +$$

$$\frac{1}{16}\,[-\;+\;+\;-\;+\;-\;-\;+\;+\;-\;-\;+\;-\;+\;+\;-]$$

where $$\Psi_{1111}(k) = [-\;+\;+\;-\;+\;-\;-\;+\;+\;-\;-\;+\;-\;+\;+\;-]$$

The added "hardware" implied by the term $$\frac{1}{16}\,\psi_{1111}(k)$$

ensures that if the network ever falls into state $b=15$, the network will revert to normal operation. Similarly, for the second set of complementary initial conditions, the assumption that $\gamma(0)=0$ will yield $$\frac{1}{N}\alpha = \frac{1}{16}\alpha = 1/2\,[1\,0\,0\,0\,0\,0\,0\,0\,0\,0\,0\,0\,0\,0\,-1\,0] +$$

$$\frac{1}{16}\,[+\;+\;+\;+\;+\;+\;+\;+\;+\;+\;+\;+\;+\;+\;+\;+]$$

ensuring that if the network falls into the "forbidden" state $b=0$, the network will self initiate.

It is important to realize that other choices for $\gamma(0)$ and (15) will yield other auxiliary characteristics. These other states may be used by the designer to optimize the parameters needed or desired.

Figure 18:
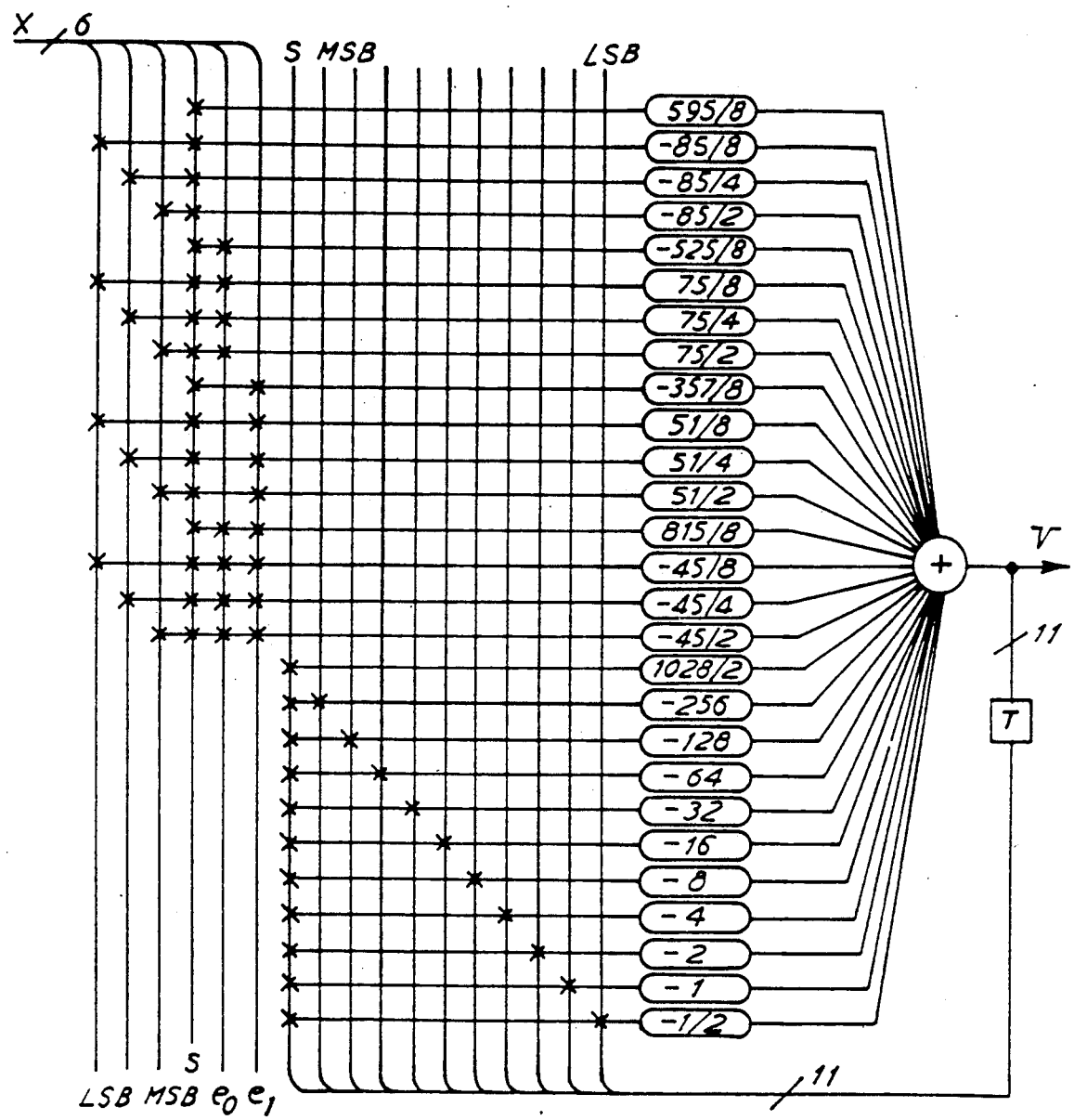
FIG. 18 shows a General Network for converting a floating point number into a signed integer number in binary format.
Figure 18:
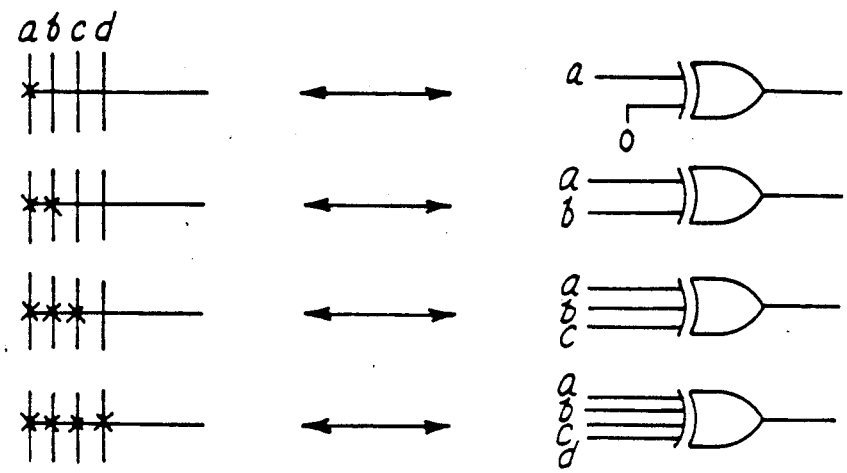

It is also important to realize that the present invention is not constrained by the type of input signal (i.e., digital, analog, fixed point, floating point, logic, etc.). As an example, consider the network shown in FIG. 18. This particular general network structure is a degenerate version of the type shown in FIG. 14 containing feed-forward and feed-back paths except that because the $\alpha$ and $\beta$ coefficient vectors are the same, the output from the adders 52 and 56 are therefore equal to $v(t)$, which is the same as feeding $v(t)$ back into the WEX network through an appropriate delay element T. The purpose of this general network is to accept a floating point sequence of numbers and produce a signed magnitude sum at the output, i.e., a floating point to fixed point signed magnitude accumulator.

The upper 16 coefficients are used to convert the incoming floating point numbers to signed magnitude fixed point numbers. By generating appropriate sum and differences of these weights, provided that the weights are stored as fixed point signed magnitude numbers and provided that the summing junction is implemented as a signed magnitude adder with at least 11 bits on the output. (The 11 bit constraint on the accumulator was arbitrarily chosen for purposes of this example only.) The floating point input, x, is in 6-bit code, where 3 bits represent a mantissa, one bit represents a sign, and two bits represent an exponent. That is $$x = (s)(xxx) \cdot 4^{eO + 2e1}$$

where $$s = \text{sign bit} = \begin{cases} 0 \to + \\ 1 \to - \end{cases}$$

$$e_k = \text{exponent bit} = \begin{cases} 0 \\ 1 \end{cases}$$

$$000 \leq xxx \leq 111$$

Thus, if the 3-bit floating point number mantissa is interpreted as an integer, it ranges from 0 to 7 and when combined with the sign bit provides a range of $+7$ or $-7$. The maximum value of the exponent is 3 so that the extreme range of numbers represented on input are $+488$ or $-448$, which corresponds to approximately a 10-bit range ($\pm 512$) using this 6-bit floating point format.

The previously described methods for obtaining the coefficient vectors $$\frac{1}{N}\alpha \text{ and } \frac{1}{N}\beta$$

may be used for synthesizing this network.

The ability to do General Network operation on floating point numbers reduces the dimensions of the General Network due to the efficiency of representing numbers in floating point format.

In general, to those skilled in the art to which this invention relates, many changes in construction and widely differing embodiments and applications of the present invention will suggest themselves without departing from its spirit and scope. For example, as has been noted, the Walsh functions are well suited to the present invention because of their ease of application in digital contexts. However, other basis sets of functions may also be used in the method and apparatus of the present invention with equivalent results. For example, the Walsh functions may be modified by transposing certain rows or columns to arrive at modified Walsh matrices. Though not identical to the Walsh matrices, these modified Walsh matrices may still yield correct results with modifications of the procedures outlined above. In fact, any orthogonal set of functions may be utilized with normalization of the coefficients under proper conditions. Thus, the disclosures and descriptions herein are purely illustrative, and are not intended to be in any sense limiting.

What is claimed is:

1. A modeling cell for modeling the input/output behavior of a reference network or system having an n-bit binary input channel, for receiving a sequence of unique n-bit state input vectors, and having at least one output channel, comprising:
   (a) time delay means coupled to each bit of said state input vector, each said time delay being independently assignable, thus forming a delayed state vector, of n-bits;
   (b) expansion means coupled to said time delay means for producing a unique $2^n$ state binary expansion vector from each said unique delayed state vector, each said state binary expansion vector being linearly independent;
   (c) one or more numerical look up tables, coupled to receive a $2^n$ state binary expansion vector, for transforming said $2^n$ state binary expansion vector to a $2^n$ state weighted expansion vector, each weight having independently assignable values related to the behavior of the reference network or system;

(d) one or more digital adders, each coupled to one of said weighing means forming the sum of the individual weights of said weighted expansion vector, each said sum being an output signal corresponding to an output of the referenced network or system.

2. A modeling cell for modeling the input/output behavior of a reference network or system having an n-bit binary input channel, for receiving a sequence of unique n-bit state input vectors, and having at least one output channel, comprising:

(a) time delay means coupled to each bit of said state input vector, each said time delay being independently assignable, thus forming a delayed state vector, of n-bits;

(b) expansion means coupled to said time delay means for producing a unique $2^n$ state binary expansion vector from each said unique delayed state vector, each said state binary expansion vector being linearly independent;

(c) one or more weighing means, coupled to receive a $2^n$ sate binary expansion vector, for transforming said $2^n$ sate binary expansion vector to a 2n state weighted expansion vector, each weight having independently assignable values related to the behavior of the reference network or system;

(d) one or more summing means, each coupled to one of said weighing means forming the sum of the individual weights of said weighted expansion vector, each said sum being an output signal corresponding to an output of the referenced network of system; and (e) one or more analog-to-digital converters for accepting analog input signals whose binary output signals constitute all of part of said state input vector.

* * * * *